United States Patent
Tao et al.

(10) Patent No.: US 9,112,506 B2
(45) Date of Patent: Aug. 18, 2015

(54) TOUCH PANEL HAVING A SINGLE-SIDED SENSING PATTERN

(71) Applicant: ELAN MICROELECTRONICS CORPORATION, Hsin Chu (TW)

(72) Inventors: Yi-Hsin Tao, Hsinchu (TW); Wen-Jun Hsu, Hsinchu (TW)

(73) Assignee: ELAN MICROELECTRONICS CORPORATION, Hsinchu (TW)

( * ) Notice: Subject to any disclaimer, the term of this patent is extended or adjusted under 35 U.S.C. 154(b) by 379 days.

(21) Appl. No.: 13/684,091

(22) Filed: Nov. 21, 2012

(65) Prior Publication Data

US 2013/0299330 A1    Nov. 14, 2013

Related U.S. Application Data

(60) Provisional application No. 61/645,386, filed on May 10, 2012.

(51) Int. Cl.
*G06F 3/045* (2006.01)
*H03K 17/96* (2006.01)
*G06F 3/044* (2006.01)

(52) U.S. Cl.
CPC ............ *H03K 17/9622* (2013.01); *G06F 3/044* (2013.01); *H03K 2017/9602* (2013.01)

(58) Field of Classification Search
CPC ..... G06F 3/044; G06F 3/0412; G06F 3/0416; G06F 2203/04111; G06F 3/041; G02F 1/13338

USPC ................................. 345/173, 174; 178/18.06
See application file for complete search history.

(56) References Cited

U.S. PATENT DOCUMENTS

| | | | |
|---|---|---|---|
| 2007/0062739 A1* | 3/2007 | Philipp et al. ............... | 178/18.06 |
| 2009/0213090 A1* | 8/2009 | Mamba et al. ................ | 345/174 |
| 2011/0025639 A1* | 2/2011 | Trend et al. ................... | 345/174 |
| 2011/0157079 A1* | 6/2011 | Wu et al. ....................... | 345/174 |
| 2011/0193801 A1* | 8/2011 | Jung et al. ..................... | 345/173 |
| 2012/0019450 A1 | 1/2012 | Huang et al. | |
| 2013/0181943 A1* | 7/2013 | Bulea et al. ................... | 345/174 |

FOREIGN PATENT DOCUMENTS

| | | |
|---|---|---|
| TW | M366120 | 10/2009 |
| TW | 201140413 | 11/2011 |
| TW | I354924 | 12/2011 |

\* cited by examiner

*Primary Examiner* — Koosha Sharifi-Tafreshi
(74) *Attorney, Agent, or Firm* — patenttm.us

(57) ABSTRACT

A touch panel has multiple first-axis sensing lines and multiple second-axis sub-sensing sets. Each first-axis sensing line has a second-axis sensing set formed therein with multiple second-axis sensing part of the second-axis sensing set spaced apart along the first axis. The second-axis sub-sensing parts at each identical coordinate of the second axis are connected to constitute a second-axis sensing line, and the first-axis sensing lines and the second-axis sensing lines are mutually crossed. As the second-axis sub-sensing parts constituting each second-axis sensing line are separately enclosed in different first-axis sensing lines, the capacitance values of capacitive coupling between the first-axis sensing lines and the second-axis sensing lines are relatively higher and more stable.

36 Claims, 11 Drawing Sheets

TOUCH PANEL HAVING A SINGLE-SIDED SENSING PATTERN

CROSS REFERENCE

This application claims the benefit of a U.S. provisional Patent Application No. 61/645,386 filed on May. 10, 2012, the disclosure of which is incorporated herein in its entirety by reference.

BACKGROUND OF THE INVENTION

1. Field of the Invention

The present invention relates to a sensing pattern of a touch panel and more particularly to a touch panel having high and stable capacitance value of capacitive coupling.

2. Description of the Related Art

Touch panels are generally classified as glass type and film type. Glass type of touch panels can be further classified as one-glass-solution (OGS) touch panels and glass-on-glass (GG) touch panels. All these types of touch panel are characterized by having first-axis sensing lines and second-axis sensing lines commonly formed on a single substrate or respectively formed on two substrates (films). The touch panel having first-axis sensing lines and second-axis sensing lines formed on a single substrate can be further classified as both sensing lines formed on the same surface of the substrate or different surfaces of the substrate. To reduce the production cost of a touch panel, designing a touch panel with single substrate and on the same surface of substrate is more preferable. Although OGS and GG types of touch panels have both sensing lines formed on a same surface of a single substrate, more complicated process are required to create jumpers/bridges for connecting with the second-axis sensing lines. To further reduce the complexity of touch panel production process, a true single layer touch panel without jumper/bridge is more desirable.

With reference to FIG. 10, a regular conventional single layer touch panel 30 has a substrate 31, multiple X-axis sensing segments 32 and multiple Y-axis sensing segments 33.

The substrate 31 has a top surface and a bottom surface.

The X-axis sensing segments 32 are formed on the top surface of the substrate 31 and spaced apart from each other along the X axis. Each X-axis sensing segment 32 has multiple fingers 321 juxtaposedly formed on and protruding from one side of the X-axis sensing segment 32.

The Y-axis sensing segments 33 and the X-axis segments 32 are alternately formed on the top surface of the substrate 31. The Y-axis sensing segments 33 are spaced apart from each other along the X axis. Each Y-axis sensing segment 33 has multiple fingers 331 juxtaposedly formed on and protruding from one side of the Y-axis sensing segment 33, and the fingers 331 of the Y-axis sensing segment 33 face and are alternately aligned with the fingers 321 of a corresponding X-axis sensing segment 32.

With regards to a ratio between the total length of the fingers 331 of each Y-axis sensing segment 33 and the overall length of a perimeter of the Y-axis sensing segment 33, the total length of the fingers 331 only shares a portion of the overall length of the perimeter of the Y-axis sensing segment 33. However, given the alternate alignment of the fingers 331 of each Y-axis sensing segment 33 and the fingers 321 of a corresponding X-axis sensing segment 32, the capacitance value generated by the capacitive coupling between each Y-axis sensing segment 33 and a corresponding X-axis sensing segment is somewhat affected. As a consequence, the generated capacitance value of the OGS touch panel 30 is relatively smaller than that of a glass-on-glass touch panel. Furthermore, as each Y-axis sensing segment 33 is arranged next to a same side of a corresponding X-axis sensing segment 32, leading lines connected with the respective Y-axis sensing segment at an identical coordinate fail to be evenly distributed over the top surface of the substrate 31.

SUMMARY OF THE INVENTION

An objective of the present invention is to provide a touch panel having a single-sided sensing pattern capable of providing high and stable capacitance value of capacitive coupling.

To achieve the foregoing objective, the touch panel having a single-sided sensing pattern has a substrate, multiple first-axis sensing lines and multiple second-axis sub-sensing sets.

The substrate has two opposite surfaces.

The first-axis sensing lines are mounted on one of the opposite surfaces of the substrate and along a first axis. Each first-axis sensing line has multiple enclosing spaces formed thereon and spaced apart from each other along a second axis.

Each second-axis sub-sensing set has multiple second-axis sub-sensing parts mounted inside the respective enclosing spaces of one of the first-axis sensing lines, wherein a perimeter of each second-axis sub-sensing part and a corresponding first-axis sensing line is spaced apart by a gap, and the second-axis sub-sensing parts on each identical coordinate of the second axis are connected to constitute a second-axis sensing line, and the second-axis sensing lines are crossed by the first-axis sensing lines.

As the second-axis sub-sensing parts constituting each second-axis sensing line are enclosed by different first-axis sensing lines, each second-axis sub-sensing part can be capacitively coupled to a corresponding first-axis sensing lines with its entire or partial perimeter. In contrast to the OGS touch panels having the alternately arranged and finger-shaped sensing segments, the touch panel of the present invention has relatively higher and more stable capacitance values of the capacitive coupling.

Other objectives, advantages and novel features of the invention will become more apparent from the following detailed description when taken in conjunction with the accompanying drawings.

BRIEF DESCRIPTION OF THE DRAWINGS

FIG. 7b is a second schematic plane view of the touch panel in FIG. 7a;

FIG. 8 is a third schematic plane view of the touch panel in FIG. 7a;

FIG. 9 is a fourth schematic plane view of the touch panel in FIG. 7a; and

DETAILED DESCRIPTION OF THE INVENTION

To allow a touch panel having a single-sided sensing pattern to have more satisfactory and stable capacitance values of capacitive coupling, the present invention provides the following embodiments.

Figure 1:
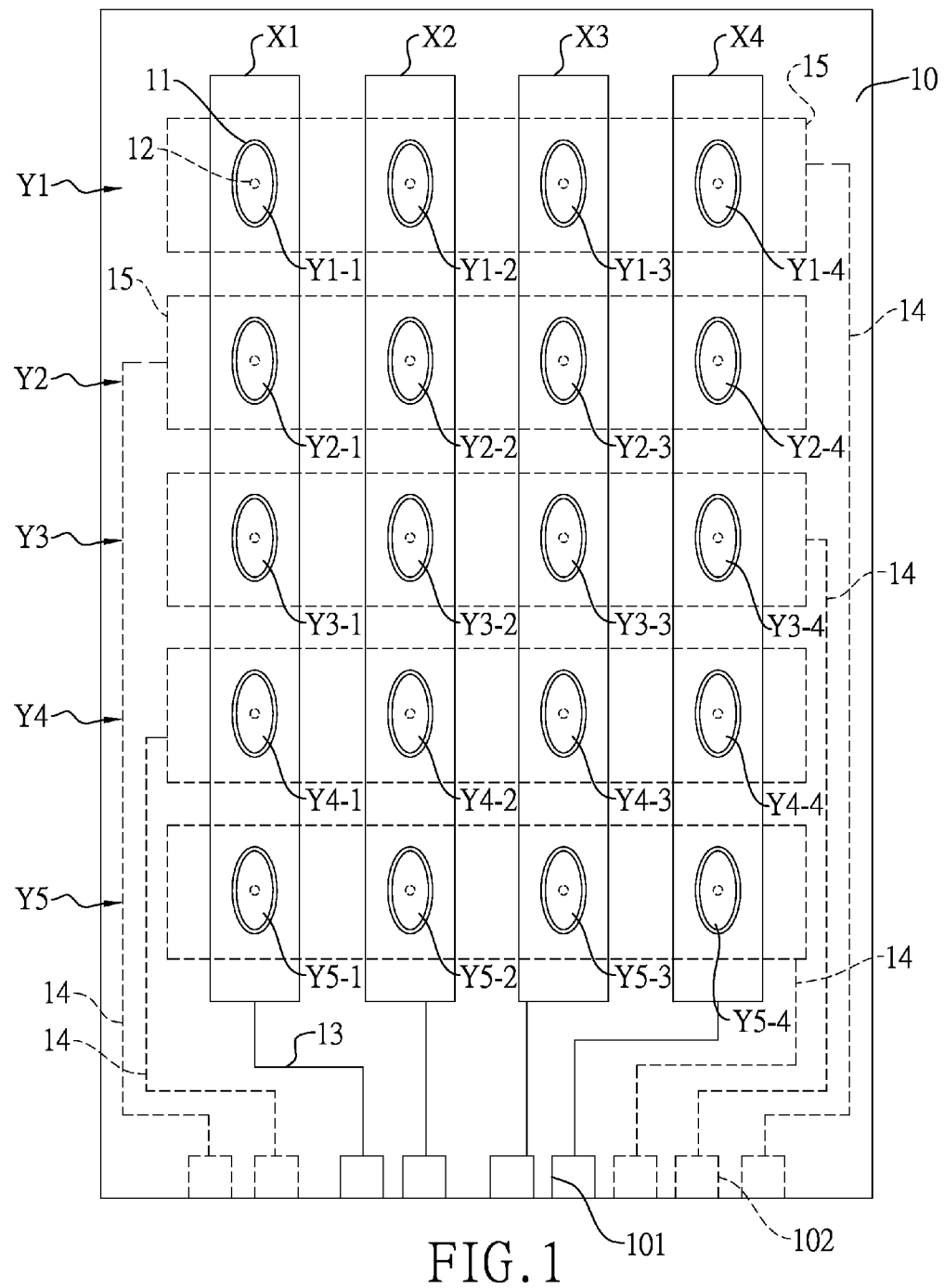
FIG. 1 is a first schematic plane view of a first embodiment of a touch panel having a single-sided sensing pattern in accordance with the present invention.

With reference to FIG. 1, a first embodiment of a touch panel in accordance with the present invention has a substrate 10, multiple first-axis sensing lines X1~X4 and multiple second-axis sub-sensing sets Y1-1~Y5-1, Y1-2~Y5-2, Y1-3~Y5-3 and Y1-4~Y5-4.

The substrate 10 has a top surface and a bottom surface.

The first-axis sensing lines X1~X4 are mounted on one of the top surface and the bottom surface of the substrate 10 and along a first axis. Each first-axis sensing line X1~X4 has multiple enclosing spaces 11 formed thereon and spaced apart from each other along a second axis. In the present embodiment, each first-axis sensing line X1~X4 extends along the second axis to take a rectangular form. Each enclosing space 11 may take a geometric shape being up-down symmetrical or left-right symmetrical, such as symmetrical geometric shapes including circle, square and the like or symmetrical typefaces including the letter 'I', the Chinese character '※' and the like.

Each second-axis sub-sensing set has multiple second-axis sub-sensing parts Y1-1~Y5-4. The second-axis sub-sensing parts Y1-1~Y5-4 of each second-axis sub-sensing set are mounted inside the respective enclosing spaces 11 of one of the first-axis sensing lines. A perimeter of each second-axis sub-sensing part and a corresponding first-axis sensing line X1~X4 is spaced apart by a gap. In the present embodiment, each second-axis sub-sensing part Y1-1~Y5-4 matches the enclosing space 11 within a corresponding first-axis sensing line X1~X4, or takes a geometric shape being up-down symmetrical or left-right symmetrical, such as symmetrical geometric shapes including circle, square and the like or symmetrical typefaces including the letter 'I', the Chinese character '※' and the like.

Figure 2:
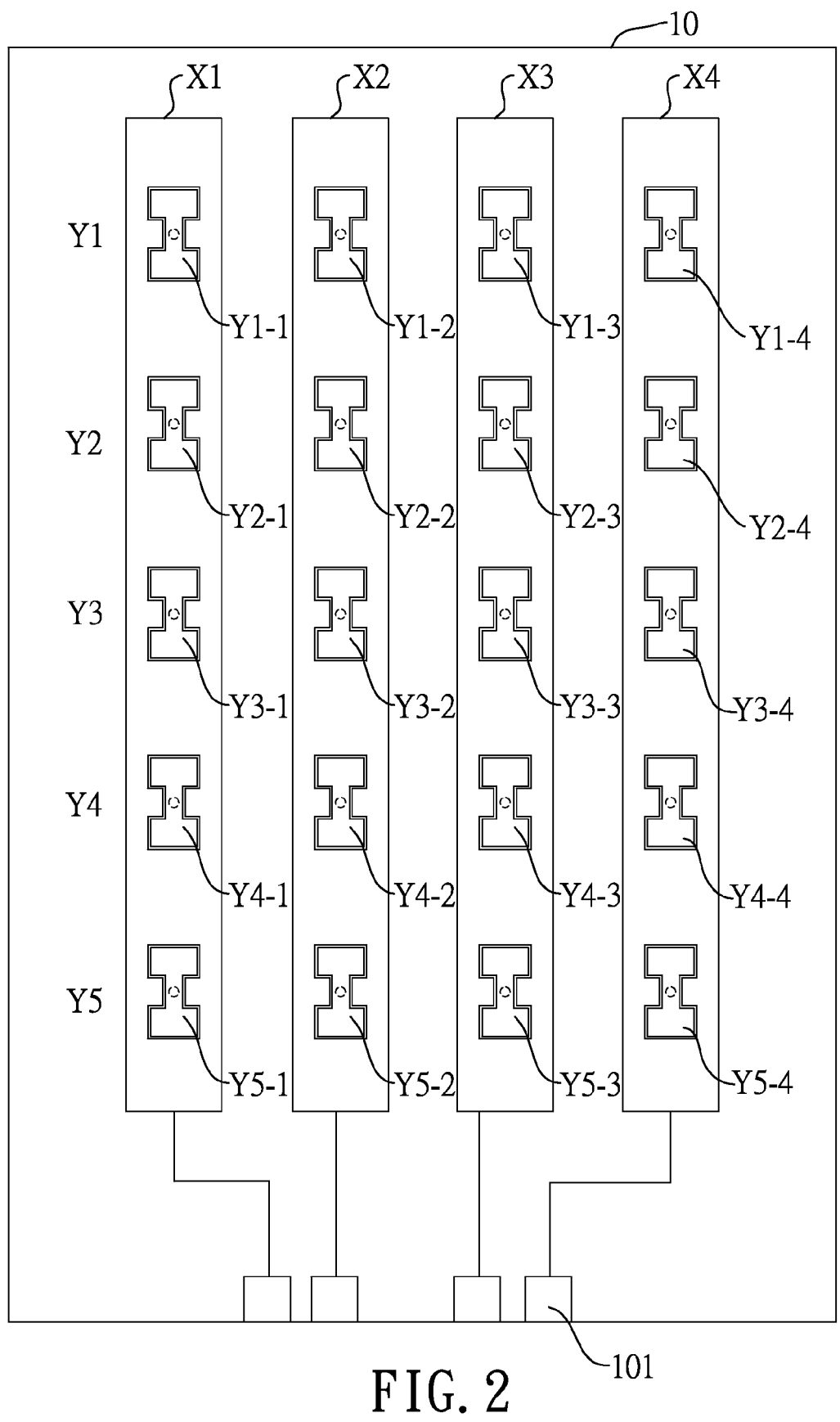
FIG. 2 is a second schematic plane view of the touch panel in FIG. 1.
Figure 3:
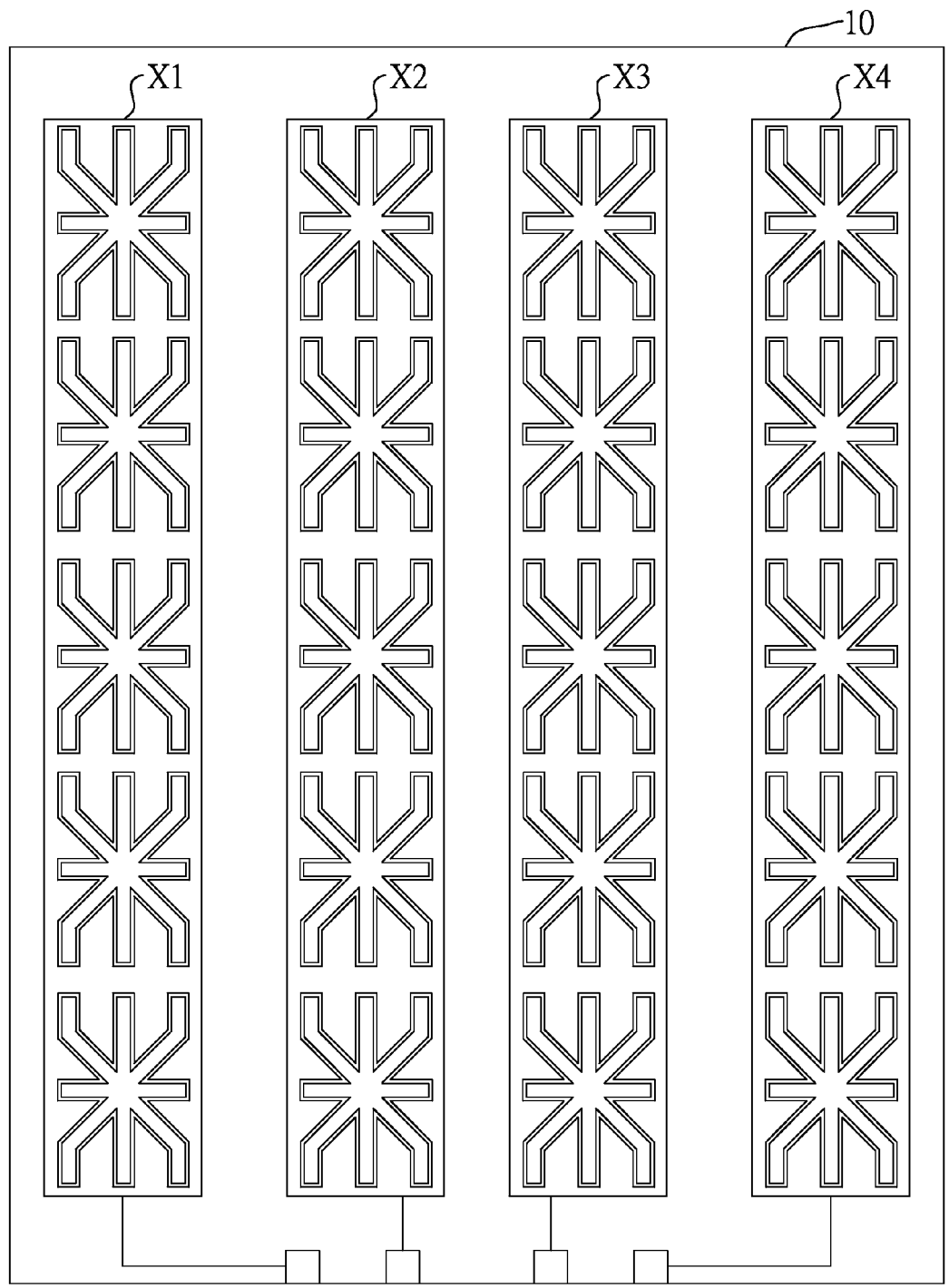
FIG. 3 is a third schematic plane view of the touch panel in FIG. 1.
Figure 4:
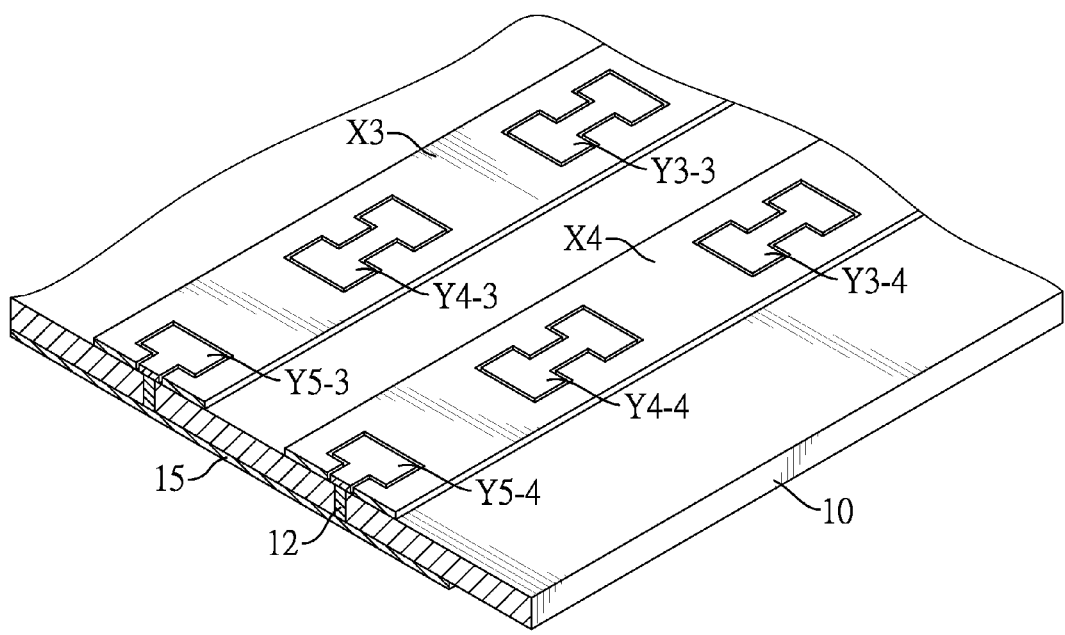
FIG. 4 is a partial cross-sectional perspective view of the touch panel in FIG. 2.
Figure 5:
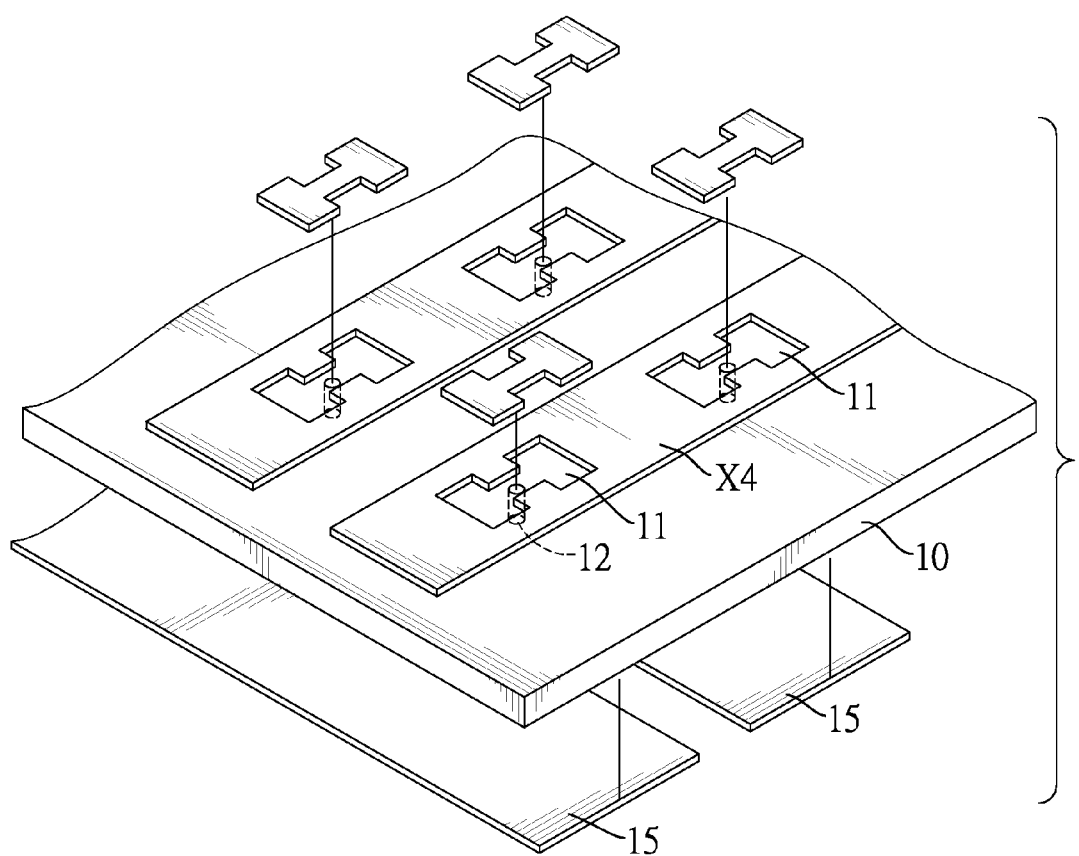
FIG. 5 is a partially exploded perspective view of the touch panel in FIG. 2.

The second-axis sub-sensing parts Y1-1~Y1-4, Y2-1~Y2-4, Y3-1~Y3-4, Y4-1~Y4-4 and Y5-1~Y5-5 grouped according to each of multiple identical coordinates Y1, Y2, Y3, Y4 and Y5 of the second axis are mutually connected. As located within different first-axis sensing lines X1~X4, the grouped second-axis sub-sensing parts Y1-1~Y1-4, Y2-1~Y2-4, Y3-1~Y3-4, Y4-1~Y4-4 and Y5-1~Y5-5 on each of the identical coordinates Y1, Y2, Y3, Y4 and Y5 of the second axis are equivalent to a second-axis sensing line Y1~Y5 crossed by the first-axis sensing lines X1~X4. In the present embodiment, the substrate 10 adopts a printed circuit board (PCB). The printed circuit board has multiple plated through holes 12 formed through the top surface and the bottom surface of the substrate 10 to correspond to the respective second-axis sub-sensing parts Y1-1~Y5-4. With reference to FIGS. 4 and 5, multiple connection wires 15 are formed on the bottom surface of the substrate 10 and juxtaposed along the second axis, and each connection wire 15 is connected to the adjacent second-axis sub-sensing parts through the corresponding plated through holes 12 so as to connect the second-axis sub-sensing parts Y1-1~Y5-4 of the corresponding second-axis sensing line Y1~Y5. As the substrate 10 has multiple first-axis sensing terminals 101 and multiple second-axis sensing terminals 102 formed on one side of the substrate to correspond to the respective first-axis sensing lines X1~X4 and the respective second-axis sensing lines Y1·Y5, the connection wire 15 connected across each second-axis sensing line Y1~Y5 is further connected to a corresponding second-axis sensing terminal 102 through a second leading line 14. Each first-axis sensing line X1~X4 on the top surface of the substrate 10 is connected to a corresponding first-axis sensing terminal 101 through a first leading line 13. As the connection wires 15 connected to the second-axis sub-sensing parts Y1-1~Y5-4 are formed on the bottom surface of the substrate 10 in the present embodiment, the second-axis sub-sensing parts Y1-1~Y5-4 can be fully surrounded by the respective first-axis sensing lines X1~X4. Hence, the entire perimeter of each second-axis sub-sensing part Y1-1~Y5-4 can be capacitively coupled to a corresponding first-axis sensing line X1~X4 to generate relatively large and stable capacitance value of the capacitive coupling. With reference to FIG. 2, the second-axis sub-sensing parts Y1-1~Y5-4 take the form of the letter 'I', which has a longer perimeter than that of the oval shape. With reference to FIG. 3, the second-axis sub-sensing parts Y1-1~Y5-4 are further designed to take the form of the Chinese character '※', which has an even longer perimeter than those of the oval form and the I-shaped form. Moreover, as the perimeter of each second-axis sub-sensing part Y1-1~Y5-4 is fully surrounded by a corresponding first-axis sensing line X1~X4, the first-axis sensing lines X1~X4 can be spaced apart from each other by a consistent gap so that the first leading lines 13 and the second leading lines 14 connecting the respective first-axis sensing lines X1~X4 and the respective second-axis sub-sensing parts Y1-1~Y5-4 to the respective first-axis sensing terminals 101 and the respective second-axis sensing terminals 102 on the side of the substrate 10 can be more symmetrically distributed.

Furthermore, since the second-axis sub-sensing parts Y1-1~Y5-4 are respectively connected to equivalently constitute the corresponding second-axis sensing lines Y1~Y5, the area of each second-axis sub-sensing part Y1-1~Y5-4 can be adjusted depending on different scanning technologies. In other words, depending on the capacitance value of capacitive coupling required for different scanning technologies, each second-axis sub-sensing part Y1-1~Y5-4 can have an adjusted area so as to define a desired perimetric distance thereof. Therefore, the area of each second-axis sub-sensing part Y1-1~Y5-4 may not be a constant.

Figure 7A:
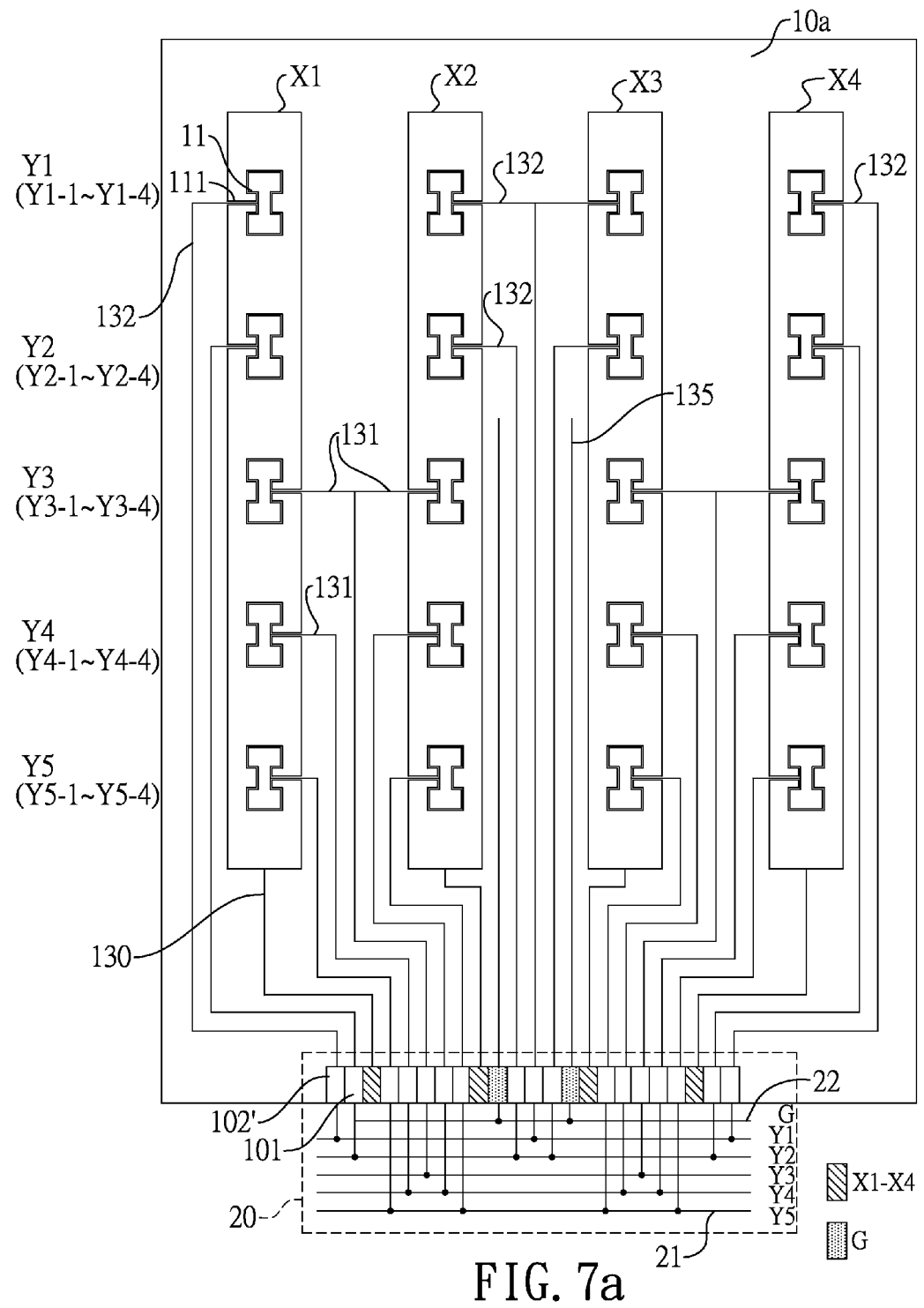
FIG. 7a is a first schematic plane view of a second embodiment of a touch panel having a single-sided sensing pattern in accordance with the present invention.

With reference to FIG. 7a, a second embodiment of a touch panel in accordance with the present invention has a substrate 10a, multiple first-axis sensing lines X1~X4, and multiple sets of second-axis sub-sensing parts Y1-1~Y5-1, Y1-2~Y5-2, Y1-3~Y5-3 and Y1-4~Y5-4.

The substrate 10a has a top surface and a bottom surface. In the present embodiment, the substrate 10a has multiple first-axis sensing terminals 101 and multiple second-axis sensing terminals 102' formed on one side of the top surface of the substrate 10a.

The first-axis sensing lines X1~X4 are mounted on one of the top surface and the bottom surface of the substrate 10a and along a first axis. Each first-axis sensing line X1~X4 has multiple enclosing spaces 11 and multiple wire slots 111. The enclosing spaces 11 are formed thereon and spaced apart from each other along a second axis. Each wire slot 111 is formed on and extends from one side of a corresponding enclosing space 11 facing a relatively long side of a corresponding first-axis sensing line and communicates with the enclosing space 11. In the present embodiment, each first-axis sensing line X1~X4 extends along the second axis to take a rectangular form. Each enclosing space 11 may take a geometric shape being up-down symmetrical, left-right symmetrical or preferably up-down and left-right symmetrical, such as symmetrical geometric shapes including circle, square and the like or symmetrical typeface including the letter 'I', the Chinese character '※' and the like.

Each set of the second-axis sub-sensing parts has multiple second-axis sub-sensing parts Y1-1~Y5-4. The second-axis sub-sensing parts Y1-1~Y5-4 of each set of the second-axis sub-sensing parts are mounted inside the respective enclosing spaces 11 of one of the first-axis sensing lines. A perimeter of each second-axis sub-sensing part and a corresponding first-axis sensing line X1~X4 is spaced apart by a gap. In the present embodiment, each second-axis sub-sensing part Y1-1~Y5-4 matches the enclosing space 11 within a corresponding first-axis sensing line X1~X4, or takes a geometric shape being up-down symmetrical, left-right symmetrical or preferably up-down and left-right symmetrical, such as symmetrical geometric shapes including circle, square and the like or symmetrical typefaces including the letter 'I', the Chinese character '※' and the like.

The second-axis sub-sensing parts Y1-1~Y1-4, Y2-1~Y2-4, Y3-1~Y3-4, Y4-1~Y4-4 and Y5-1~Y5-5 grouped according to each of the multiple identical coordinates Y1, Y2, Y3, Y4 and Y5 of the second axis are mutually connected. As located within different first-axis sensing lines X1~X4, the grouped second-axis sub-sensing parts Y1-1~Y1-4, Y2-1~Y2-4, Y3-1~Y3-4, Y4-1~Y4-4 and Y5-1~Y5-5 on each of the identical coordinates Y1, Y2, Y3, Y4 and Y5 of the second axis are equivalent to a second-axis sensing line Y1~Y5 crossed by the first-axis sensing lines X1~X4. In the present embodiment, the substrate 10a is a transparent substrate, such as a glass plate, a transparent film or the like. The substrate 10a has multiple leading lines 130, 131, 132. Each of a part of the leading lines 130 is connected between a corresponding first-axis sensing line X1~X4 and a corresponding first-axis sensing terminal 101. One end of each of the remaining portion of the leading lines 131, 132 penetrates through a corresponding wire slot 111 of a corresponding first-axis sensing line X1~X4 to connect with a corresponding second-axis sub-sensing part Y1-1~Y5-4, and the other end is connected to a corresponding second-axis sub-sensing terminal 102'.

Although each first-axis sensing line X1~X4 in the present embodiment has the wire slots 111 for the leading lines 131, 132 to connect to the second-axis sub-sensing parts Y1-1~Y5-4 inside the respective enclosing spaces 11, in view of a slot opening width of each wire slot 111 being far less than the perimetric distance of a corresponding second-axis sub-sensing part Y1-1~Y5-4, most of the perimetric distance of each second-axis sub-sensing part Y1-1~Y5-4 can be capacitively coupled to a corresponding first-axis sensing line X1~X4 to similarly generate relatively large and stable capacitance value of the capacitive coupling. In other words, the top side, bottom side, left side and right side of each second-axis sub-sensing part still surround a corresponding enclosing space 11 of a corresponding first-axis sensing line X1~X4. Similarly, the second-axis sub-sensing parts Y1-1~Y5-4 taking the form of the letter 'I' has a longer perimeter than that of the oval shape. The second-axis sub-sensing parts Y1-1~Y5-4 designed to take the similar form of the Chinese character '※' as shown in FIG. 3, have an even longer perimeter than those of the oval form and the I-shaped form.

In the present embodiment, the first-axis sensing lines X1~X4 can be juxtaposedly arranged and spaced apart from each other by a consistent gap so that the second-axis sub-sensing parts Y1-1~Y5-4 can be connected using different wiring means. For example, with reference to FIG. 7a, a double-sided connection means is implemented by having the wire slots 111 of each first-axis sensing line X1~X4 adjacent to the respective sensing terminals 101, 102' extending through one relatively long side of a corresponding first-axis sensing line X1~X4 while having the wire slots 111 of the first-axis sensing line X1~X4 distal from the respective sensing terminals 101, 102' extending through the other relatively long side of the first-axis sensing line X1~X4, so that the first leading lines 131 and the second leading lines 132 can be more evenly and symmetrically distributed alongside the two relatively long sides of the respective first-axis sensing lines X1~X4. Besides, the wire slots of adjacent two of the first-axis sensing lines, such as X1/X2 or X3/X4, may extend along two opposite directions. As the metal leading lines 132b can be formed on two opposite edge portions of the top surface of the substrate 10a, with reference to FIG. 7b, the second leading lines 132 on the two side portions of the substrate 10a can partially employ transparent leading lines 132a and metal leading lines 132b. The first-axis sensing terminals 101 and the second-axis sensing terminals 102 of the substrate 10a are connected to a flexible PCB 20. The flexible PCB 20 has multiple sub-sensing connection lines 21. Each sub-sensing connection line 21 is connected to a part of the second-axis sub-sensing parts Y1-1~Y5-4. Hence, the second-axis sub-sensing parts Y1-1~Y5-4 in the present embodiment can be connected in series through the flexible PCB 20.

Figure 7B:
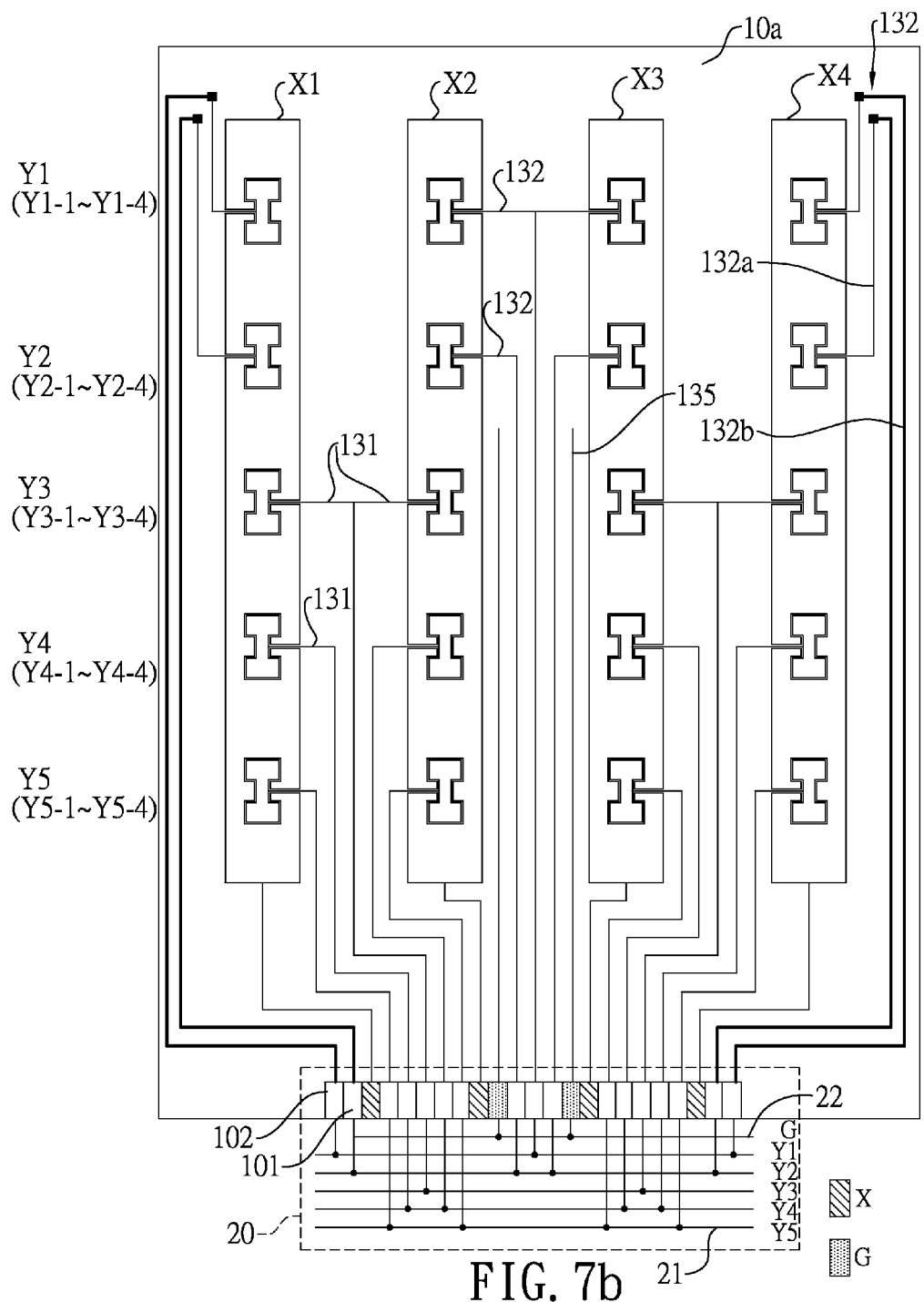

Furthermore, to prevent the excitation signals of the second leading lines 132 from interfering with the second-axis sub-sensing parts Y3-2, Y3-3, Y4-2, Y4-3, Y5-2 and Y5-3 passed by, multiple signal-masking leading lines 135 are respectively formed between part of the second leading lines 132 and the adjacent first-axis sensing lines X2, X3. With reference to FIG. 7a or 7b, two signal-masking leading lines 135 are located between the first-axis sensing lines X2, X3. One end of each signal-masking leading line 135 is connected to the ground 22.

Figure 8:
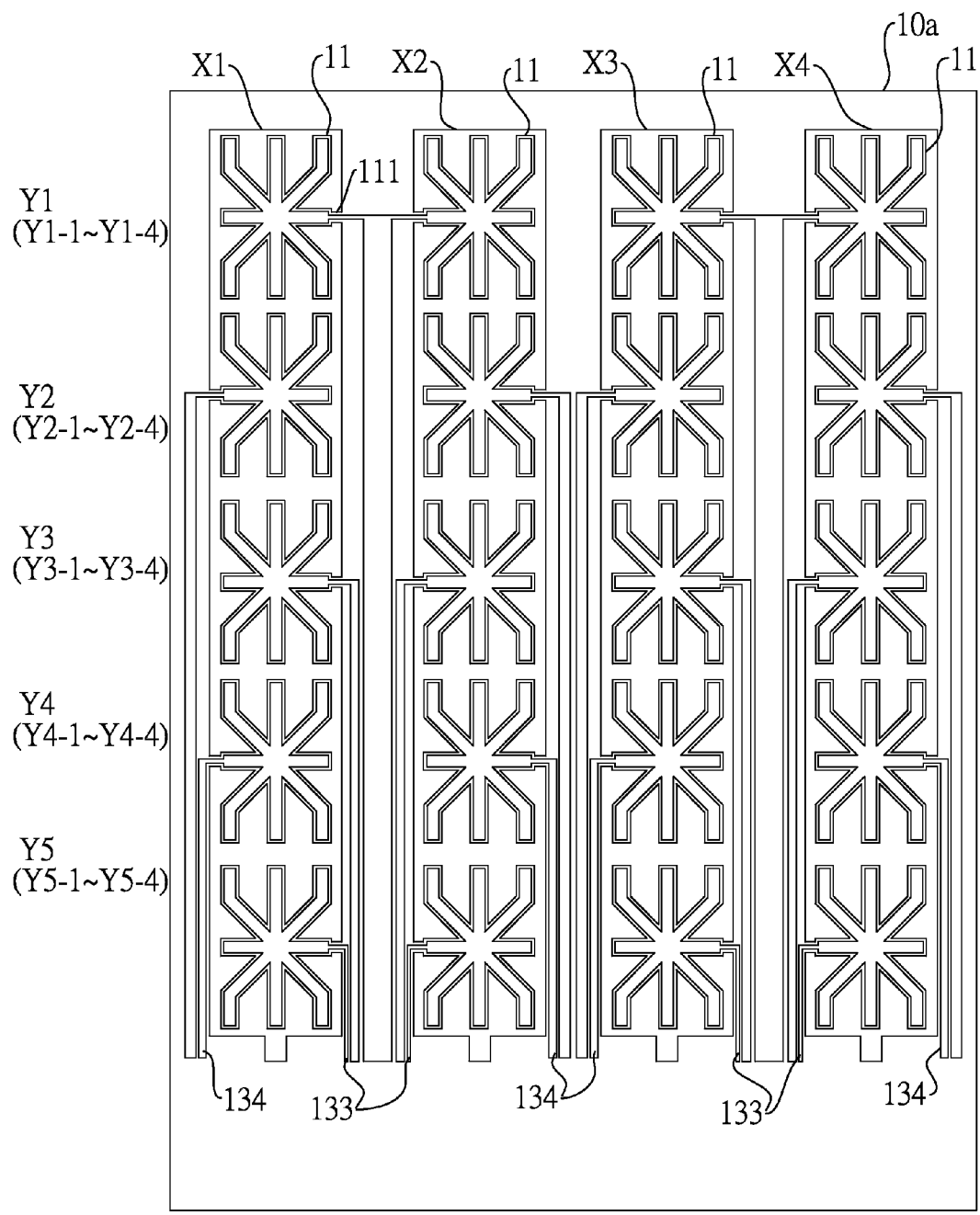

With reference to FIG. 8, another wiring means of the leading wires connected to the second-axis sub-sensing parts Y1-1~Y5-4 differs from the foregoing embodiment in FIG. 7a in that the odd wire slots 111 of each first-axis sensing line X1~X4 are formed through one of the relatively long side of the first-axis sensing line X1~X4 and the even wire slots 111 are formed through the other relatively long side of the first-axis sensing line X1~X4. The adjacent two relatively long sides of each adjacent two of the first-axis sensing wires X1/X2, X3/X4 through which the corresponding wire slots 111 are formed through may be opposite. Hence, multiple third leading lines 133 and multiple fourth leading lines 134 can be connected to the wire slots 111 respectively formed through the two relatively long sides of each first-axis sensing line X1~X4 with each two opposite wire slots of each adjacent two of the first-axis sensing lines X1/X2, X2/X3, X3/X4 connected to symmetric two of the third leading lines 133 or the fourth leading lines 134. Thus, the third leading lines 133 and the fourth leading lines 134 can be more evenly and symmetrically distributed on the substrate 10a. Additionally, the wire slots of each adjacent two of the first-axis sensing lines X1/X2, X2/X3, X3/X4 may extend along two opposite directions.

Regardless of which wiring means is employed, to make the signal intensity of the scanning signals or sensing signals independent of the lengths of the first and second leading lines 131, 132 or of the third and fourth leading lines 133, 134, it is critical to keep the resistance of the first and second leading lines 131, 132 or of the third and fourth leading lines 133, 134 consistent. As a result, the transparent leading lines that are more distant from the sensing terminals need to be wider than those more adjacent to the sensing terminals (measured based on sheet resistors)

Figure 6:
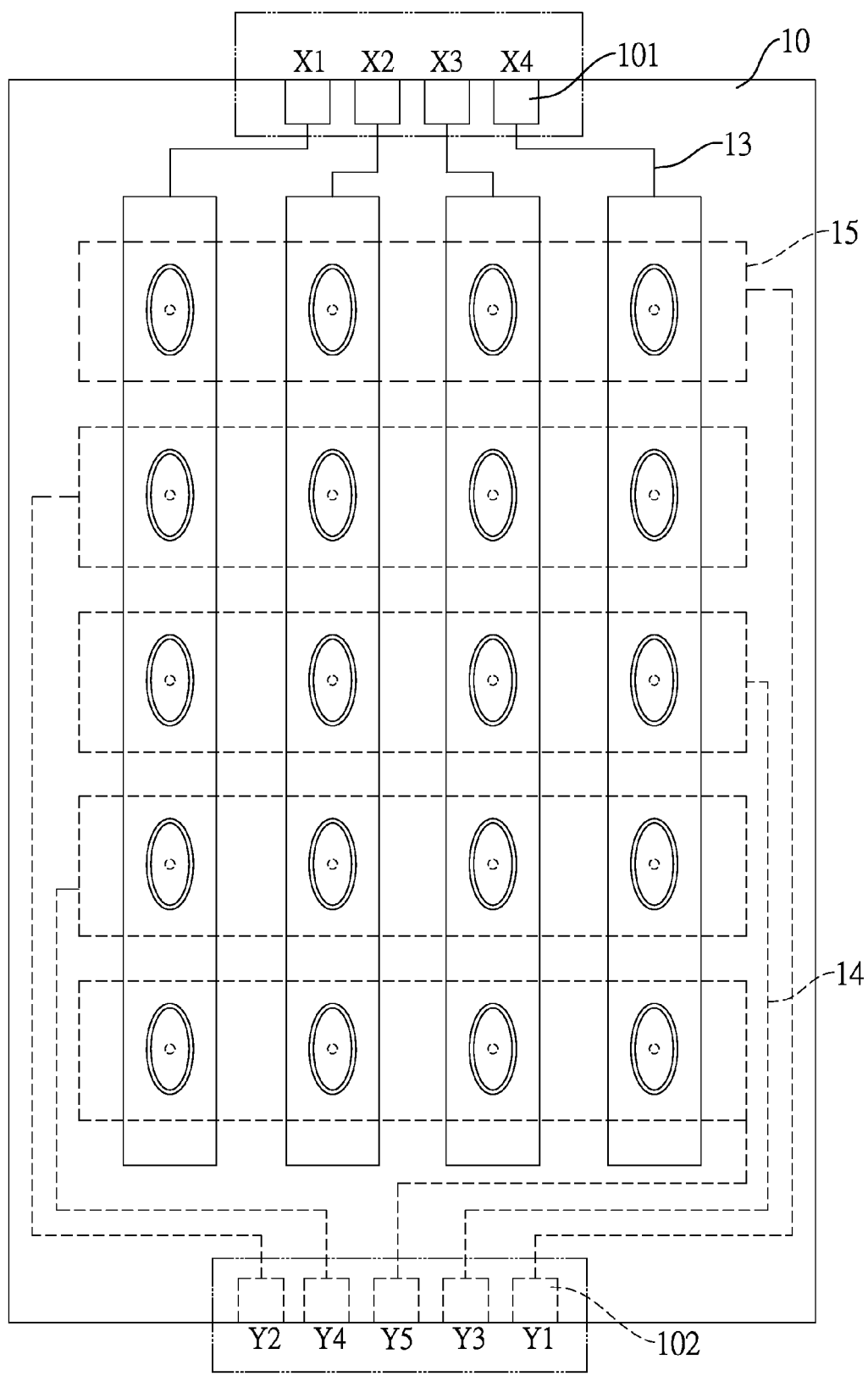
FIG. 6 is another schematic plane view of the touch panel in FIG. 1.
Figure 9:
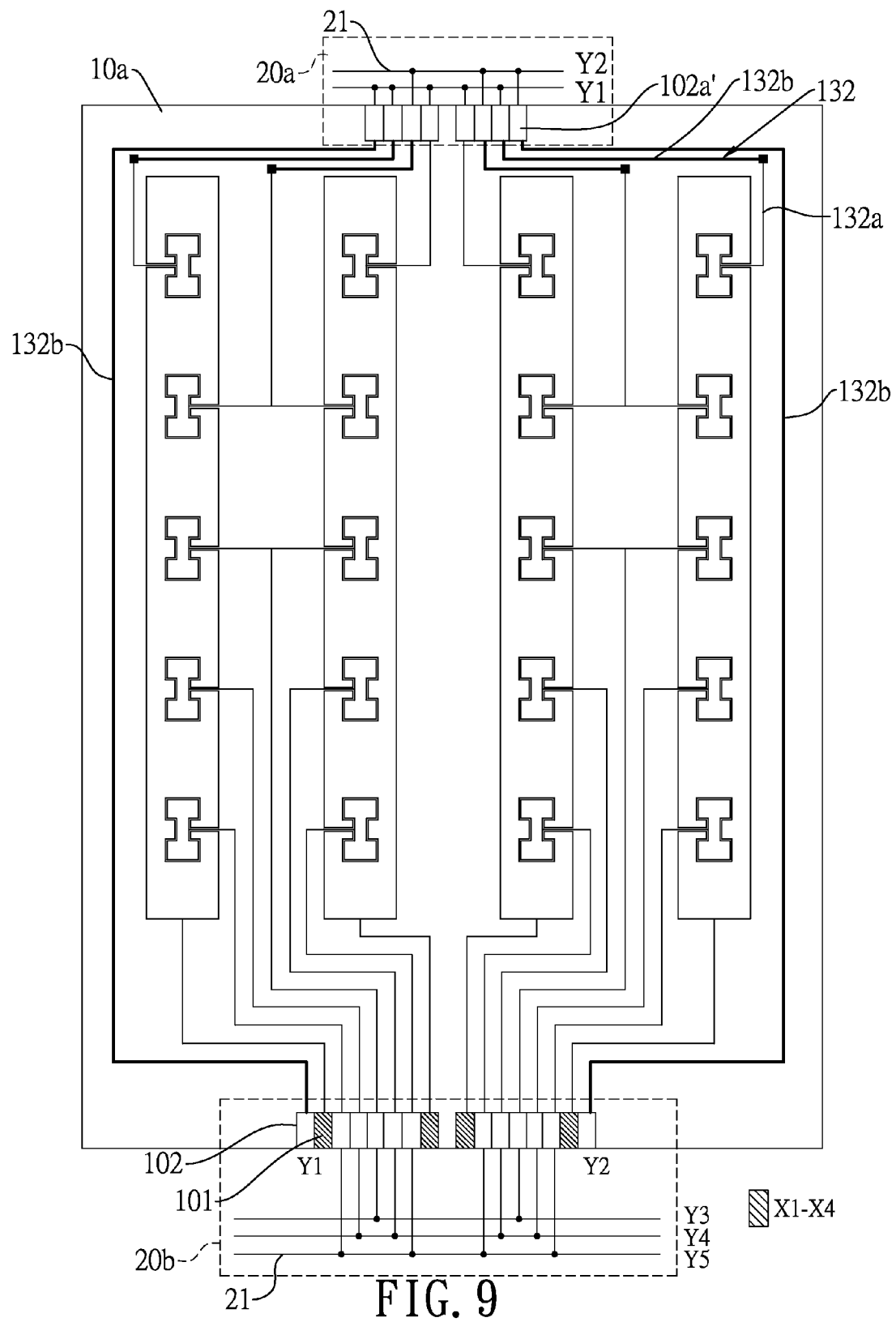
Figure 10:
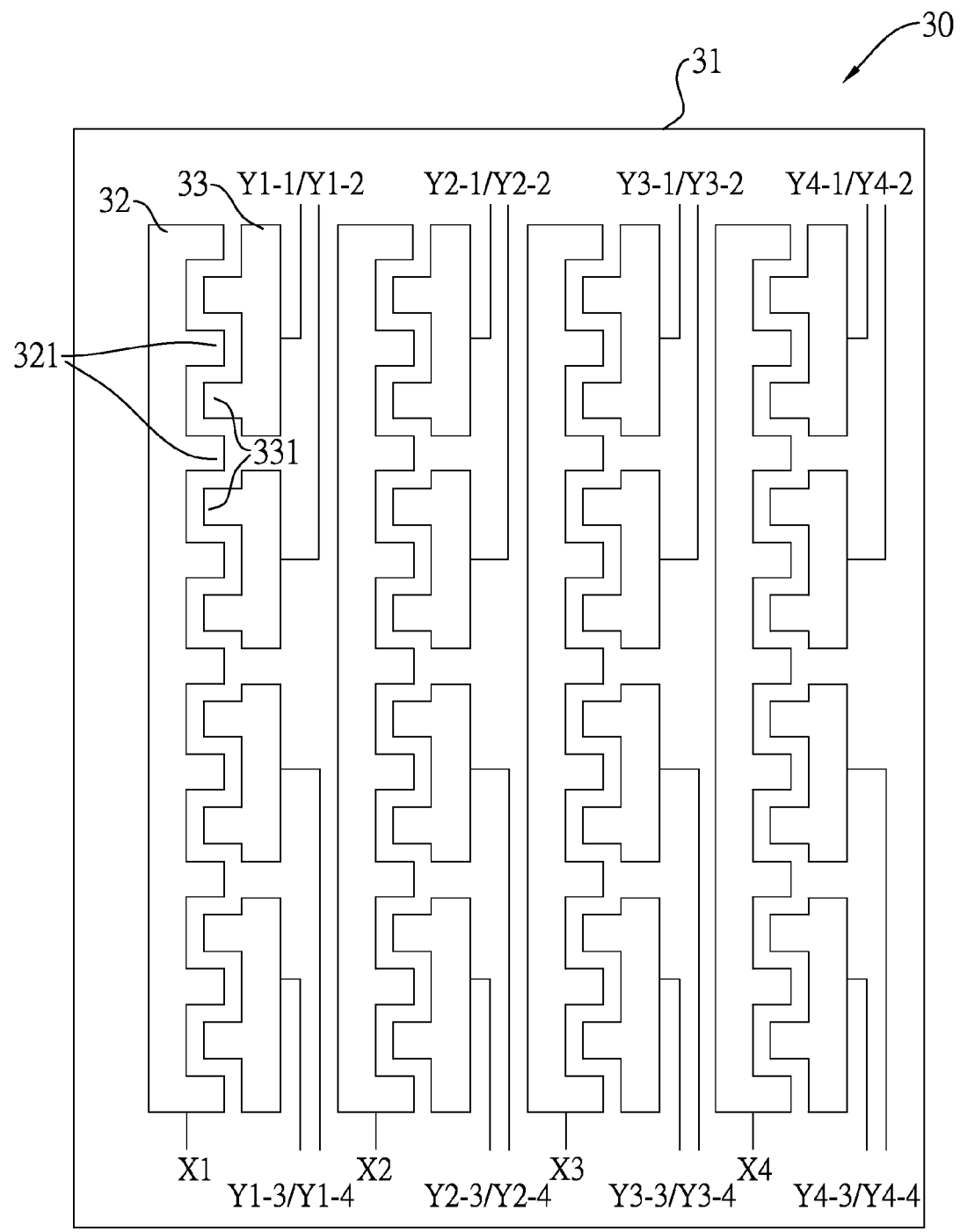
FIG. 10 is a schematic plane view of a conventional touch panel having a single-sided sensing pattern.

With reference to FIGS. 6 and 9, two sets of sensing terminals are formed on each of the substrates 10, 10a. Starting from the substrate 10a shown in FIG. 6, the first-axis sensing terminals 101 and the second-axis sensing terminals 102 are respectively formed on two opposite sides of the substrate 10. The first-axis sensing lines X1~X4 on the top surface of the substrate 10 are connected to the respective first-axis sensing terminals on one side of the top surface through the corresponding first leading lines 13. The connection wires 15 on the bottom surface are connected to the respective second-axis sensing terminals 102 through the corresponding second leading lines 14. As to the substrate 10a shown in FIG. 9, the first-axis sensing terminals 101 and the second-axis sub-sensing terminals 102a' are respectively formed on two opposite sides on the top surface of the substrate 10a so that the second-axis sub-sensing parts Y1-1~Y2-4 far away from the single-sided sensing terminals as shown in FIG. 7a can be directly connected to the corresponding second-axis sub-sensing terminals 102a' through the corresponding leading lines 132 and are further connected to the second-axis sensing terminals 102 on the opposite side through the metal leading lines 132b after the second-axis sub-sensing terminals 102a' are connected to the corresponding sub-sensing connection lines 21 of the flexible PCB 20. The first-axis sensing terminals 101 and the second-axis sensing terminals 102 are connected to another flexible PCB 20b.

In sum, the touch panel of the present invention has the second-axis sub-sensing parts enclosed by the respective first-axis sensing lines so that the entire and most of the perimeters of each second-axis sub-sensing part can be capacitively coupled to the corresponding first-axis sensing line. In contrast to the typical type one layer touch panels having the alternately arranged and finger-shaped sensing segments, the touch panel of the present invention has relatively higher and more stable capacitance values of the capacitive coupling.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A touch panel having a single-sided sensing pattern comprising:
    a substrate having two opposite surfaces;
    multiple first-axis sensing lines mounted on one of the opposite surfaces of the substrate and along a first axis, each first-axis sensing line having
        multiple enclosing spaces formed thereon and spaced apart from each other along a second axis; and
        multiple wire slots, and each wire slot formed on and extending from one side of a corresponding enclosing space, which faces a relatively long side of a corresponding first-axis sensing line, and communicates with the enclosing space; and
    multiple second-axis sub-sensing sets, each having multiple second-axis sub-sensing parts mounted inside the respective enclosing spaces of one of the first-axis sensing lines, wherein a perimeter of each second-axis sub-sensing part and a corresponding first-axis sensing line is spaced apart by a gap, the second-axis sub-sensing parts on each identical coordinate of the second axis are connected to constitute a second-axis sensing line, and the second-axis sensing lines are crossed by the first-axis sensing lines, wherein a slot opening width of each wire slot is smaller than a perimetric distance of a corresponding second-axis sub-sensing part.

2. The touch panel as claimed in claim 1, wherein each second-axis sub-sensing part takes a geometric shape being up-down symmetrical, left-right symmetrical, or up-down and left-right symmetrical.

3. The touch panel as claimed in claim 2, wherein the geometric shape being up-down and left-right symmetrical includes a typeface of a letter 'I' or a Chinese character ' 米 '.

4. The touch panel as claimed in claim 3, wherein each second-axis sub-sensing part matches the enclosing space within a corresponding first-axis sensing line.

5. The touch panel as claimed in claim 1, wherein the substrate further has: multiple first-axis sensing terminals and multiple second-axis sub-sensing terminals formed on one side of the substrate; and multiple connection wires respectively connected to the first-axis sensing terminal through multiple first leading lines and to the second-axis sub-sensing terminals through multiple second leading lines.

6. The touch panel as claimed in claim 2, wherein the substrate further has: multiple first-axis sensing terminals and multiple second-axis sub-sensing terminals formed on one side of the substrate; and multiple connection wires respectively connected to the first-axis sensing terminal through multiple first leading lines and to the second-axis sub-sensing terminals through multiple second leading lines.

7. The touch panel as claimed in claim 3, wherein the substrate further has:
    multiple first-axis sensing terminals and multiple second-axis sub-sensing terminals formed on one side of the substrate; and
    multiple connection wires respectively connected to the first-axis sensing terminal through multiple first leading lines and to the second-axis sub-sensing terminals through multiple second leading lines.

8. The touch panel as claimed in claim 4, wherein the substrate further has:
    multiple first-axis sensing terminals and multiple second-axis sub-sensing terminals formed on one side of the substrate; and
    multiple connection wires respectively connected to the first-axis sensing terminal through multiple first leading lines and to the second-axis sub-sensing terminals through multiple second leading lines.

9. The touch panel as claimed in claim 5, wherein the first-axis sensing terminals and the second-axis sensing terminals of the substrate are connected to a flexible printed circuit board (PCB), the flexible PCB has multiple sub-sensing connection lines, and each sub-sensing connection line is connected to a part of the second-axis sub-sensing terminals.

10. The touch panel as claimed in claim 6, wherein the first-axis sensing terminals and the second-axis sensing terminals of the substrate are connected to a flexible PCB, the flexible PCB has multiple sub-sensing connection lines, and each sub-sensing connection line is connected to a part of the second-axis sub-sensing terminals.

11. The touch panel as claimed in claim 7, wherein the first-axis sensing terminals and the second-axis sensing terminals of the substrate are connected to a flexible PCB, the flexible PCB has multiple sub-sensing connection lines, and each sub-sensing connection line is connected to a part of the second-axis sub-sensing terminals.

12. The touch panel as claimed in claim 8, wherein the first-axis sensing terminals and the second-axis sensing terminals of the substrate are connected to a flexible PCB, the flexible PCB has multiple sub-sensing connection lines, and each sub-sensing connection line is connected to a part of the second-axis sub-sensing terminals.

13. The touch panel as claimed in claim 5, wherein the substrate further has:
 multiple first-axis sensing terminals and multiple second-axis sensing terminals formed on one side of the substrate;
 multiple second-axis sub-sensing terminals formed on an opposite side of the substrate relative to the first-axis sensing terminals and the second-axis sensing terminals; and
 multiple leading wires respectively connecting the first-axis sensing lines and the second-axis sub-sensing parts to the first-axis sensing terminals and the second-axis sub-sensing terminals and respectively connecting the second-axis sub-sensing terminals to the second-axis sensing terminals.

14. The touch panel as claimed in claim 6, wherein the substrate further has:
 multiple first-axis sensing terminals and multiple second-axis sensing terminals formed on one side of the substrate;
 multiple second-axis sub-sensing terminals formed on an opposite side of the substrate relative to the first-axis sensing terminals and the second-axis sensing terminals; and
 multiple leading wires respectively connecting the first-axis sensing lines and the second-axis sub-sensing parts to the first-axis sensing terminals and the second-axis sub-sensing terminals and respectively connecting the second-axis sub-sensing terminals to the second-axis sensing terminals.

15. The touch panel as claimed in claim 7, wherein the substrate further has:
 multiple first-axis sensing terminals and multiple second-axis sensing terminals formed on one side of the substrate;
 multiple second-axis sub-sensing terminals formed on an opposite side of the substrate relative to the first-axis sensing terminals and the second-axis sensing terminals; and
 multiple leading wires respectively connecting the first-axis sensing lines and the second-axis sub-sensing parts to the first-axis sensing terminals and the second-axis sub-sensing terminals and respectively connecting the second-axis sub-sensing terminals to the second-axis sensing terminals.

16. The touch panel as claimed in claim 8, wherein the substrate further has:
 multiple first-axis sensing terminals and multiple second-axis sensing terminals formed on one side of the substrate;
 multiple second-axis sub-sensing terminals formed on an opposite side of the substrate relative to the first-axis sensing terminals and the second-axis sensing terminals; and
 multiple leading wires respectively connecting the first-axis sensing lines and the second-axis sub-sensing parts to the first-axis sensing terminals and the second-axis sub-sensing terminals and respectively connecting the second-axis sub-sensing terminals to the second-axis sensing terminals.

17. The touch panel as claimed in claim 13, wherein the first-axis sensing terminals, the second-axis sensing terminals and the second-axis sub-sensing terminals are respectively connected to two flexible PCBs, the flexible PCB connected to the second-axis sub-sensing terminals has multiple sub-sensing connection lines, and each sub-sensing connection line is connected to a part of the second-axis sensing terminals.

18. The touch panel as claimed in claim 14, wherein the first-axis sensing terminals, the second-axis sensing terminals and the second-axis sub-sensing terminals are respectively connected to two flexible PCBs, the flexible PCB connected to the second-axis sub-sensing terminals has multiple sub-sensing connection lines, and each sub-sensing connection line is connected to a part of the second-axis sensing terminals.

19. The touch panel as claimed in claim 15, wherein the first-axis sensing terminals, the second-axis sensing terminals and the second-axis sub-sensing terminals are respectively connected to two flexible PCBs, the flexible PCB connected to the second-axis sub-sensing terminals has multiple sub-sensing connection lines, and each sub-sensing connection line is connected to a part of the second-axis sensing terminals.

20. The touch panel as claimed in claim 16, wherein the first-axis sensing terminals, the second-axis sensing terminals and the second-axis sub-sensing terminals are respectively connected to two flexible PCBs, the flexible PCB connected to the second-axis sub-sensing terminals has multiple sub-sensing connection lines, and each sub-sensing connection line is connected to a part of the second-axis sensing terminals.

21. The touch panel as claimed in claim 5, wherein the leading wires connected to a part of the second leading lines connected to the corresponding second-axis sub-sensing terminals are transparent leading lines or metal leading lines.

22. The touch panel as claimed in claim 6, wherein the leading wires connected to a part of the second leading lines connected to the corresponding second-axis sub-sensing terminals are transparent leading lines or metal leading lines.

23. The touch panel as claimed in claim 7, wherein the leading wires connected to a part of the second leading lines connected to the corresponding second-axis sub-sensing terminals are transparent leading lines or metal leading lines.

24. The touch panel as claimed in claim 8, wherein the leading wires connected to a part of the second leading lines connected to the corresponding second-axis sub-sensing terminals are transparent leading lines or metal leading lines.

25. The touch panel as claimed in claim 9, wherein the leading wires connected to a part of the second leading lines connected to the corresponding second-axis sub-sensing terminals are transparent leading lines or metal leading lines.

26. The touch panel as claimed in claim 10, wherein the leading wires connected to a part of the second leading lines connected to the corresponding second-axis sub-sensing terminals are transparent leading lines or metal leading lines.

27. The touch panel as claimed in claim 11, wherein the leading wires connected to a part of the second leading lines connected to the corresponding second-axis sub-sensing terminals are transparent leading lines or metal leading lines.

28. The touch panel as claimed in claim 12, wherein the leading wires connected to a part of the second leading lines connected to the corresponding second-axis sub-sensing terminals are transparent leading lines or metal leading lines.

29. The touch panel as claimed in claim 13, wherein the leading wires connected to a part of the second leading lines connected to the corresponding second-axis sub-sensing terminals are transparent leading lines or metal leading lines.

30. The touch panel as claimed in claim 14, wherein the leading wires connected to a part of the second leading lines connected to the corresponding second-axis sub-sensing terminals are transparent leading lines or metal leading lines.

31. The touch panel as claimed in claim 15, wherein the leading wires connected to a part of the second leading lines connected to the corresponding second-axis sub-sensing terminals are transparent leading lines or metal leading lines.

32. The touch panel as claimed in claim 16, wherein the leading wires connected to a part of the second leading lines connected to the corresponding second-axis sub-sensing terminals are transparent leading lines or metal leading lines.

33. The touch panel as claimed in claim 17, wherein the leading wires connected to a part of the second leading lines connected to the corresponding second-axis sub-sensing terminals are transparent leading lines or metal leading lines.

34. The touch panel as claimed in claim 18, wherein the leading wires connected to a part of the second leading lines connected to the corresponding second-axis sub-sensing terminals are transparent leading lines or metal leading lines.

35. The touch panel as claimed in claim 19, wherein the leading wires connected to a part of the second leading lines connected to the corresponding second-axis sub-sensing terminals are transparent leading lines or metal leading lines.

36. The touch panel as claimed in claim 20, wherein the leading wires connected to a part of the second leading lines connected to the corresponding second-axis sub-sensing terminals are transparent leading lines or metal leading lines.

* * * * *